United States Patent
Fratin et al.

(10) Patent No.: US 6,507,067 B1
(45) Date of Patent: Jan. 14, 2003

(54) FLASH EEPROM WITH INTEGRATED DEVICE FOR LIMITING THE ERASE SOURCE VOLTAGE

(75) Inventors: Lorenzo Fratin, Buccinasco (IT); Leonardo Ravazzi, Dalmine (IT); Carlo Riva, Renate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1097 days.

(21) Appl. No.: 08/692,936

(22) Filed: Jul. 31, 1996

(30) Foreign Application Priority Data

Aug. 2, 1995 (EP) .............................. 95830351

(51) Int. Cl.[7] .......................................... H01L 29/788
(52) U.S. Cl. ..................................... 257/315; 257/316
(58) Field of Search .......................... 257/46, 47, 315, 257/316, 356, 357

(56) References Cited

U.S. PATENT DOCUMENTS

| 3,470,390 A | * | 9/1969 | Lin | |
| 3,999,212 A | | 12/1976 | Usuda | 257/356 |
| 4,356,502 A | * | 10/1982 | Yamada | 257/356 |
| 4,882,707 A | * | 11/1989 | Mizutani | 257/316 |
| 4,893,159 A | * | 1/1990 | Suzuki et al. | 257/360 |
| 5,208,474 A | * | 5/1993 | Yamagata et al. | 257/356 |
| 5,212,398 A | | 5/1993 | Matsunaga et al. | 257/356 |
| 5,280,446 A | * | 1/1994 | Ma et al | 257/314 |
| 5,293,057 A | | 3/1994 | Ho et al. | 257/356 |
| 5,301,084 A | * | 4/1994 | Miller | 257/356 |
| 5,388,084 A | * | 2/1995 | Itoh et al. | 365/185.27 |
| 5,438,213 A | * | 8/1995 | Tailliet | 257/360 |
| 5,479,039 A | * | 12/1995 | Lien | 257/356 |
| 5,521,415 A | * | 5/1996 | Kondo | 257/356 |
| 5,528,064 A | * | 6/1996 | Thiel et al. | 257/356 |
| 5,535,084 A | * | 7/1996 | Nakayama | 257/356 |

FOREIGN PATENT DOCUMENTS

| JP | 60-037155 | * | 2/1985 | 257/356 |
| JP | 60-231355 | * | 11/1985 | 257/360 |
| JP | 61-53761 | * | 3/1986 | 257/360 |
| JP | 2-119262 | * | 5/1990 | 257/362 |
| JP | 6-151785 | * | 5/1994 | 257/315 |

OTHER PUBLICATIONS

Atsumi, Shigeru et al., "A 16–Mb Flash EEPROM with a New Self–Data–Refresh Scheme for a Sector Erase Operation," *IEICE Transactions on Electronics*, E77–C, No. 5, Tokyo, May 1994, pp. 791–798.

* cited by examiner

*Primary Examiner*—Phat X. Cao
(74) *Attorney, Agent, or Firm*—Lisa K. Jorgenson; Robert Iannucci; Seed IP Law Group PLLC

(57) ABSTRACT

A flash EEPROM having an array of memory cells which include a common source line connecting together source electrodes of the memory cells. A resistive feedback element is coupled in series between the common source line and a positive potential when the memory cells must be electrically erased. The Flash EEPROM includes a voltage limiting circuit coupled to the common source line for limiting the potential of the common source line to be prescribed maximum value lower than the positive potential.

11 Claims, 4 Drawing Sheets

FLASH EEPROM WITH INTEGRATED DEVICE FOR LIMITING THE ERASE SOURCE VOLTAGE

TECHNICAL FIELD

The present invention relates to a Flash EEPROM with an integrated device for limiting the erase source voltage.

BACKGROUND OF THE INVENTION

It is known that the distinctive feature of Flash EEPROMs over other non-volatile semiconductor memories is the possibility to electrically erase large groups of memory cells simultaneously.

A Flash EEPROM memory cell is a floating-gate MOSFET having an N type source region and an N type drain region formed in a spaced-apart condition in a P type semiconductor layer. The portion of the P type layer between the source and drain regions forms a channel region, and a polysilicon floating gate is placed above the channel region with the interposition of a gate oxide layer. A polysilicon control gate is insulatively disposed over the floating gate. The groups of memory cells which are to be simultaneously erased have the source electrodes commonly connected to a common source line.

In dual power supply Flash EEPROMs, requiring a first external power supply typically of 5 V+/−10% and a second external power supply of approximately 12 V+/−10%, erasure of the memory cells is carried out by applying a high positive voltage to the common source line of the group of memory cells that must be erased, while keeping the control gate electrodes grounded and the drain electrodes floating. In this way, The Fowler-Nordheim tunneling theory occurs, wherein a strong electric field develops in the gate oxide layer causing electrons trapped in the floating gate to tunnel into the source region through the gate oxide layer.

The high electric fields at the surface of the source regions and at the junction between the source regions and the P type layer give rise to hot carrier generation and to large source-to-substrate currents, leakage currents, which are several order of magnitude higher than the Fowler-Nordheim tunneling current.

To control the source-to-substrate currents and the generation of hot carriers, a resistive feedback is normally provided between the 12 V external power supply and the common source line of the group of memory cells that must be erased. Such a resistive feedback is for example the resistivity of a switching transistor provided in series to the common source line to allow switching of the common source line potential between ground, in READ and PROGRAM mode, and the 12 V power supply, in ERASE mode. The actual voltage of the common source line thus depends on the voltage drop across the resistive feedback, the latter depending in turn on the source-to-substrate current, the Fowler-Nordheim current is negligible.

The source-to-substrate current is maximum at the beginning of erasing, when the potential of the floating gate is more negative due to the electrons trapped therein. As erasing proceeds, electrons are extracted from the floating gate and the potential of the latter becomes less negative. The electric fields at the surface of the source regions and at the junction between the source regions and the P type layer decreases, and so does the source-to-substrate current. The voltage drop across the resistive feedback decreases, and the potential of the common source line increases towards 12 V.

In the final phases of erasing, the potential of the common source line of the source regions of the memory cells become unnecessarily high, and this causes the memory cells, especially those that have a low erasing time to be submitted to electric stresses that reduce the memory cell reliability.

SUMMARY OF THE INVENTION

In view of the state of the art described, it is an object of the present invention to provide a Flash EEPROM having a device suitable to limit the potential of the source regions of the memory cells during erase, without negatively affecting the reliability of the memory cells.

According to the present invention, such object is achieved by a Flash EEPROM having an array of memory cells which include a common source line connecting together the source electrodes of the memory cells. A resistive feedback element is coupled in series between the common source line and a positive potential when the memory cells must be electrically erased. The positive potential and the common source line include a voltage limiting device coupled to the common source line for limiting the potential of the common source line to a prescribed maximum value lower than said positive potential.

Thanks to the present invention, it is possible to limit the source potential of the memory cells in the final phases of erasing, to reduce the electric stresses to which the memory cells are submitted. This increases the memory cells' reliability.

The voltage limiting device can be embodied by a simple junction diode with cathode coupled to the common source line and anode coupled to a ground potential: in this way, when the potential of the common source line reaches the breakdown voltage of the diode, the latter clamps the potential of the common source line preventing any further increase. If the breakdown voltage of the junction diode is too low, a plurality of serially connected diodes can be provided: in this way, the potential of the common source line is clamped to a voltage equal to the sum of the breakdown voltages of the diodes of the plurality.

In an alternative embodiment, the voltage limiting device can be a bipolar junction transistor, with the emitter coupled to the common source line, collector coupled to ground, and base floating. The potential of the common source line is clamped to a voltage equal to the turn-on voltage of the bipolar junction transistor.

BRIEF DESCRIPTION OF THE DRAWINGS

The features of the present invention will be made more evident by the following detailed description of two particular embodiments, described as non limiting examples in the annexed drawings.

DESCRIPTION OF THE INVENTION

Figure 1:
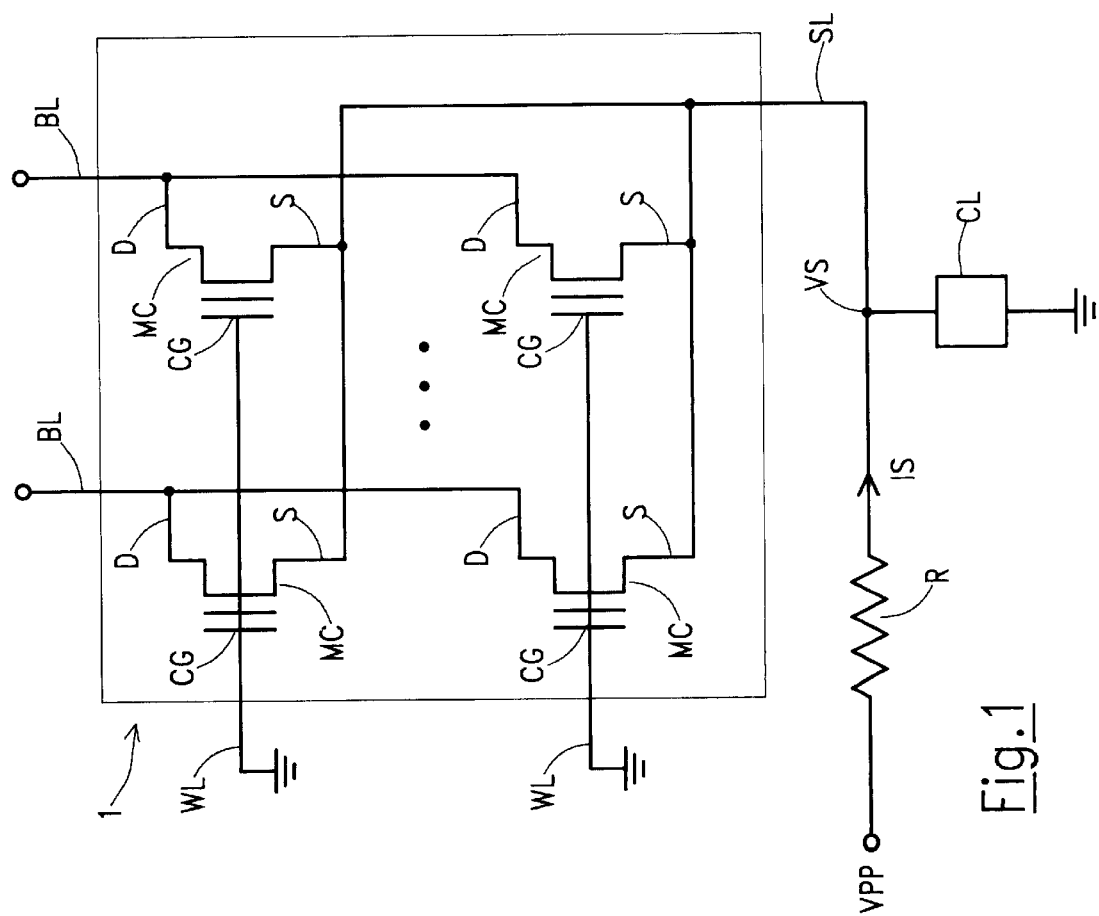
FIG. 1 schematically shows a Flash EEPROM provided with a voltage limiting device according to the present invention.

With reference to FIG. 1, a Flash EEPROM is schematically shown. The Flash EEPROM includes an array 1 of memory cells MC; each memory cell MC has a drain electrode D connected to a respective bit line BL, a control gate electrode CG connected to a respective word line WL and a source electrode S connected to a common source line SL to which the source electrodes S of all the memory cells MC of the array 1 are also connected.

In ERASE mode, the bit lines BL are left floating, the word lines WL are tied to a ground potential GND and the common source line SL is coupled to a high positive external power supply VPP of 12 V+/−10% by means of a resistive feedback, indicated in FIG. 1 by a resistor R. In practical implementations, the resistive feedback can effectively be an integrated resistor, or it can be represented by the internal resistance of a switching transistor (not shown) that allows to switch the potential of the common source line SL from ground, when the Flash EEPROM is operated in READ or PROGRAM modes, to the high positive external power supply VPP.

According to the present invention, a voltage limiting device, or clamping device CL, is also connected between the common source line SL and ground. The clamping device CL is normally off, and activates when the voltage of the common source line SL reaches a clamping voltage VCL lower than VPP.

Figure 2:
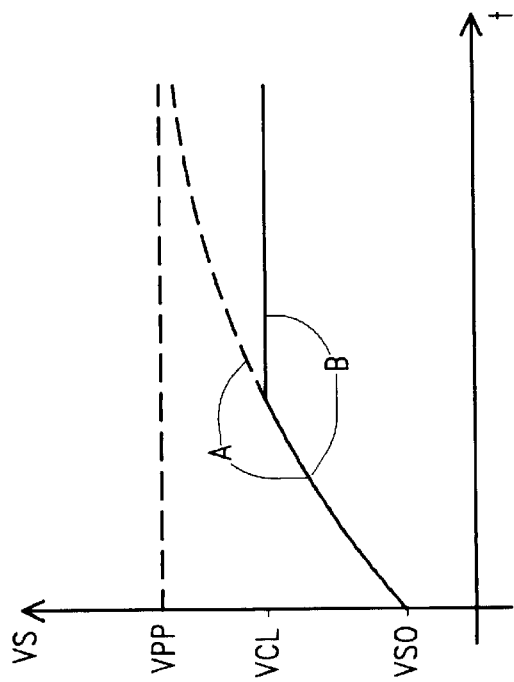
FIG. 2 is a comparative diagram showing the variation of the erase source voltage of the memory cells in the prior art case and in the case of the present invention.

In FIG. 2, t represents the erasing time and VS the potential of the common source line SL. Curve A shows the variation of the voltage VS in the case of the prior art: at the beginning of erasing the voltage VS has a value VS0 that depends on the value of the sum IS of the source-to-substrate currents of the memory cells, as previously mentioned, the Fowler-Nordheim current is negligible. As erasing proceeds, the source-to-substrate current decreases, the voltage drop across the feedback resistor R decreases, and the voltage VS asymptotically approaches VPP.

Curve B in FIG. 2 shows the case of the present invention: starting from the value VS0, the voltage VS increases in the same way as in the prior art case, but when VS reaches the voltage VCL, the clamping device CL activates and any further increase of the voltage VS is prevented. In this way, the electric stress on the memory cells is reduced and the memory cell reliability increases.

Figure 3:
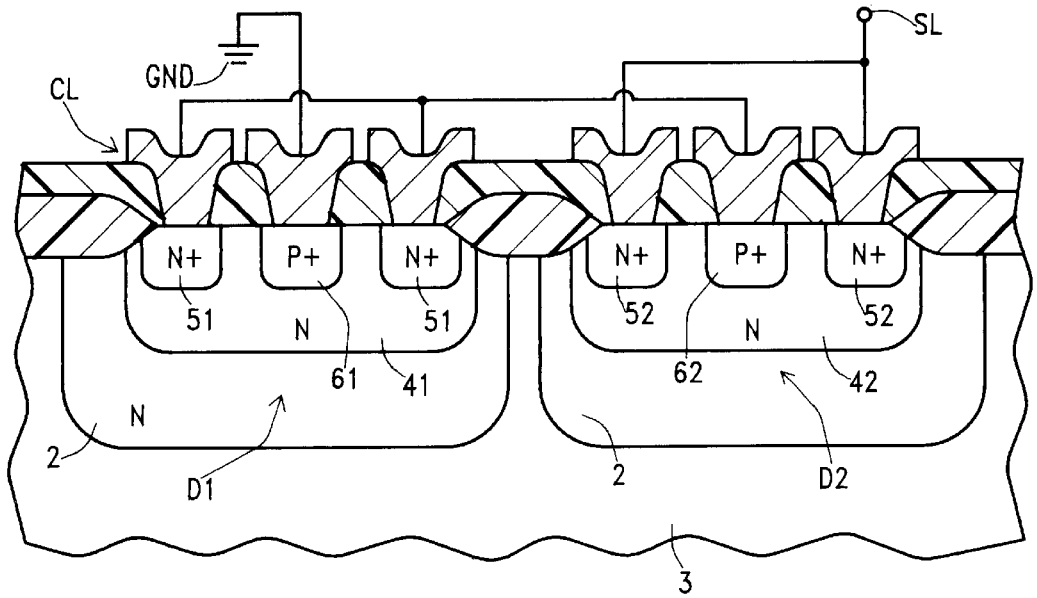
FIG. 3 is a cross-sectional view of a voltage limiting device according to a first embodiment of the invention.

FIG. 3 is a cross-sectional view of a clamping device according to a first embodiment of the present invention. In this embodiment the clamping device CL includes two diodes D1, D2 connected in series. The diodes D1, D2 are formed in respective N type wells 2 formed in a semiconductor substrate 3. Each diode D1, D2 has an N type cathode region 41, 42 formed by diffusion in the N type well 2. An N+ contact region 51, 52 is formed inside the cathode region 41, 42 of each diode D1, D2. The contact region 51, 52 can be annular in shape. A P+ anode region 61, 62 is formed in the cathode region 41, 42, inside the annular contact region 51, 52.

The anode region 61 of D1 is connected to ground, the contact region 51 of D1 is connected to the anode region 62 of D2, and the contact region 52 of D2 is connected to the common source line SL.

With this arrangement, when the voltage VS reaches a value equal to the sum of the breakdown voltages of D1 and D2, the diodes break down, thus limiting the voltage VS.

The doping profile of the cathode regions 41, 42 is important since it determines the breakdown voltage of the diodes. In the shown example, it is supposed that each diode has a breakdown voltage ranging from 5 V to 5.75 V. Consequently, two serially connected diodes have been used to provide a clamping voltage VCL ranging from 10 V to 11.5 V. However, it should be understood that a different number of serially connected diodes could be used, depending on the particular breakdown voltage of the diodes obtainable in the available manufacturing process.

Figure 4:
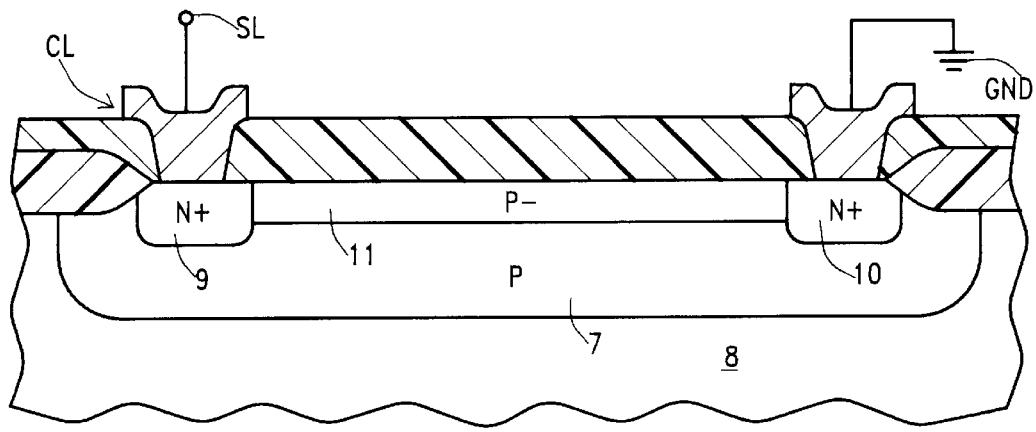
FIG. 4 is a cross-sectional view of a voltage limiting device according to a second embodiment of the invention.

FIG. 4 is a cross-sectional view of a clamping device according to a second embodiment of the invention. In this embodiment, the clamping device CL includes a floating-base lateral NPN bipolar junction transistor (BJT). The transistor is formed in a P type well region 7 formed in a semiconductor substrate 8. Inside the P type well 7, an N+ emitter region 9 and an N+ collector region 10 are formed. Between the emitter and collector regions 9, 10, a P-base region 11 is formed.

The emitter region 9 is coupled to the common source line SL, the collector region 10 is coupled to ground, and the base region 11 is left floating.

In this embodiment, the clamping voltage VCL is given by the turn-on voltage of the BJT which determines the onset of the emitter/collector conduction. The turn-on voltage of the BJT can be adjusted to the desired value by a proper dimensioning of the area of the BJT base region 11. Also in this case, it is thus possible to obtain a clamping voltage VCL ranging from 10 V to 11.5 V.

FIGS. 5 to 8 are cross-sectional views showing some intermediate steps of a manufacturing process of the clamping device according to the first embodiment of the invention.

Starting from a silicon substrate 3, for example of the P type, field oxide regions 12 are formed on the substrate 3. Field oxide regions are formed by means of a standard LOCOS process to define active areas of suitable dimensions. In this same step, the field oxide regions 12 form active areas for both the array 1 of memory cells MC and N-channel and P-channel MOSFETs of the logic circuits of the Flash EEPROM.

Figure 5:
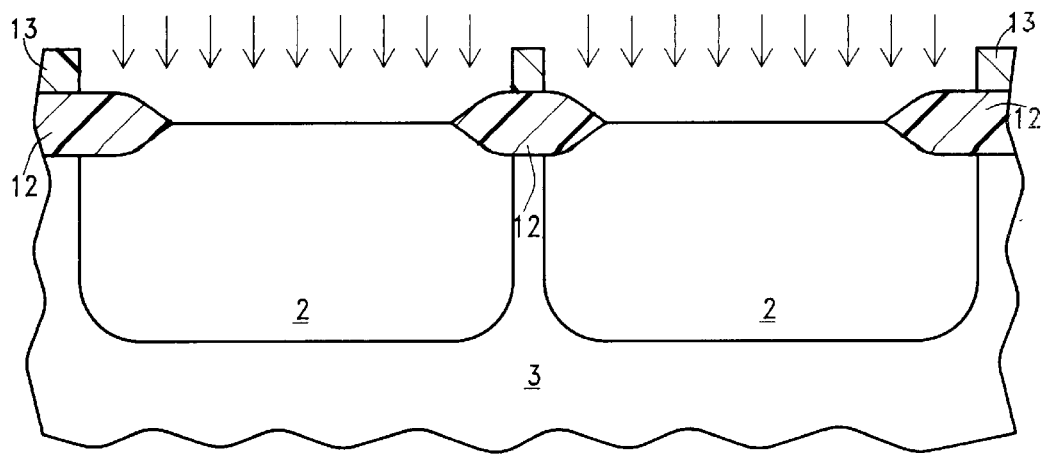
FIGS. 5 to 8 are cross-sectional views taken at intermediate steps of a manufacturing process of the voltage limiting device of FIG. 3.

A layer of photoresist 13 is then deposited and selectively removed by a photolithographic process involving a first photolithographic mask over the active areas. Next, an N type dopant is implanted in a dose of the order of $10^{13}$ atoms/cm$^2$ and with an energy of the order of 1 MeV to form the N type wells 2 as shown in FIG. 5. In this same step, N type wells are formed in the areas where P-channel MOSFETs are to be formed. Any known N type dopant can be used, for example, phosphorus.

Figure 6:
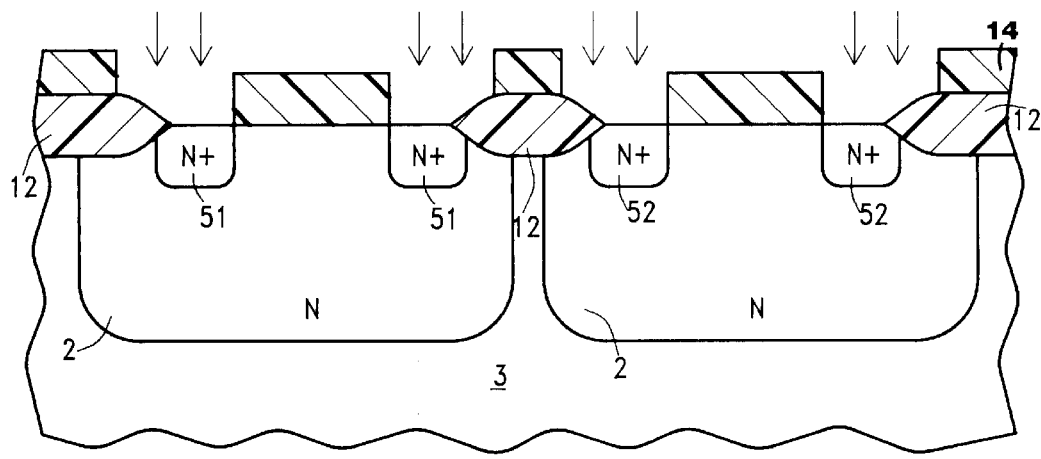

The first photoresist 13 is removed and a second layer of photoresist 14 is then deposited and selectively removed as shown in FIG. 6. The second layer of photoresist 14 is formed by a photolithographic process over the substrate 3 and field oxide regions 12. An N type dopant, for example arsenic in a dose of approximately $10^{15}$ atoms/cm$^2$, is selectively implanted into the N type wells 2 to form the annular contact regions 51, 52 of the diodes D1, D2. In this same step, source regions and drain regions of the N-channel MOSFETs are also formed.

Figure 7:
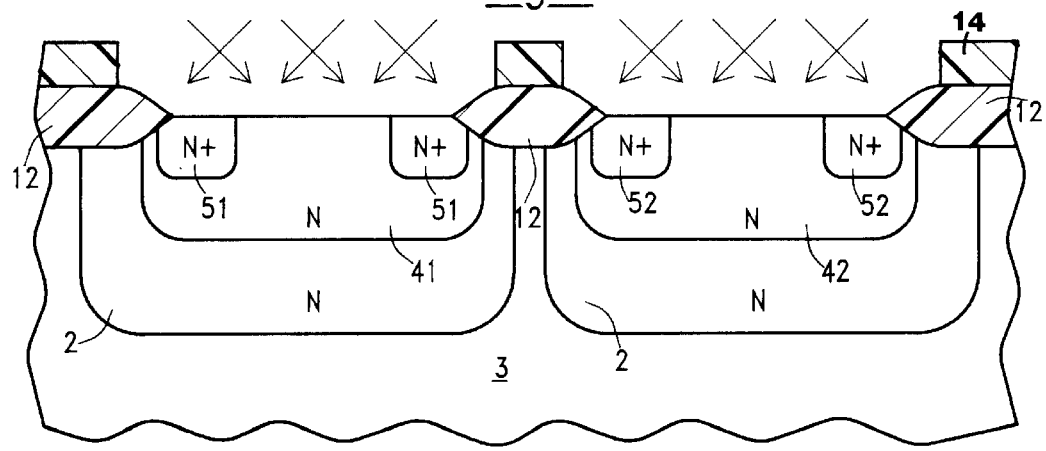

As illustrated in FIG. 7, a third photoresist layer is formed that removes the central portions over the active areas as shown in FIG. 6. An N type dopant, for example phosphorus in a dose ranging from $1-5 \times 10^{14}$ atoms/cm$^2$ and with an energy of 50–100 keV, is then implanted into the whole active area of the diodes D1 and D2 with an implantation angle of approximately 45°, to form the cathode regions 41 and 42 of the diodes D1 and D2. This same implant is used to form graded source and drain regions of the N-channel MOSFETs.

Figure 8:
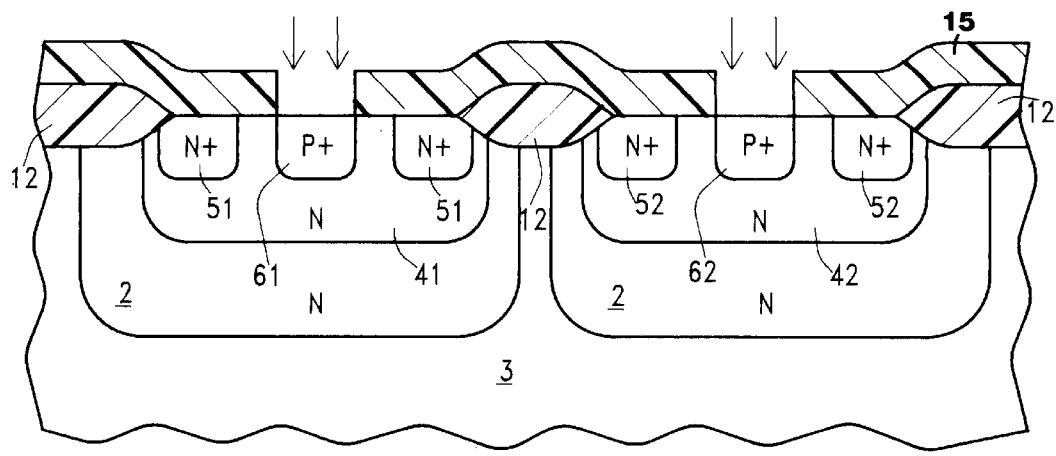

FIG. 8 shows the steps of forming a fourth layer 15 of photoresist over the substrate 3 and selectively removing portions of said fourth layer 15 to expose a central portion of said active areas. A P type dopant, for example BF2 in a dose in the range $1-5 \times 10^{15}$ atoms/cm$^2$ and with an energy of 20–50 keV, is then selectively implanted into the cathode regions 41, 42 to form the anode regions 61 and 62 of the diodes D1 and D2 within said active areas. In this same step, source regions and drain regions of the P-channel MOSFETs are formed.

The subsequent process steps provide, in a totally conventional way, for forming contacts to the anode regions 61, 62 and to the contact regions 51, 52 of the diodes D1, D2, and for forming metal interconnection lines.

It is worth noting that the diodes D1 and D2 forming the clamping device can be fabricated in a typical N-well or twin-well CMOS Flash EEPROM manufacturing process making use of process steps already available; in other words, they don't require additional process steps.

Figure 9:
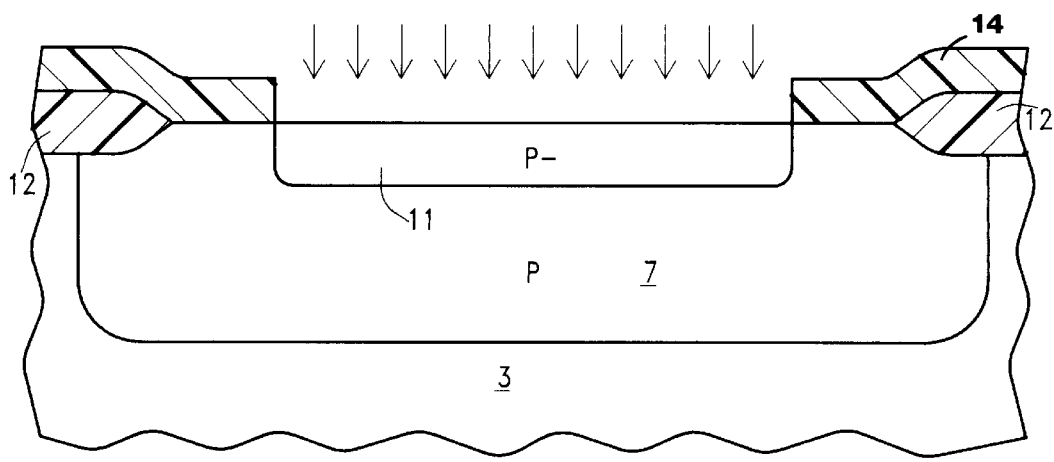
FIGS. 9 and 10 are cross-sectional views taken at intermediate steps of a manufacturing process of the voltage limiting device of FIG. 4.
Figure 10:
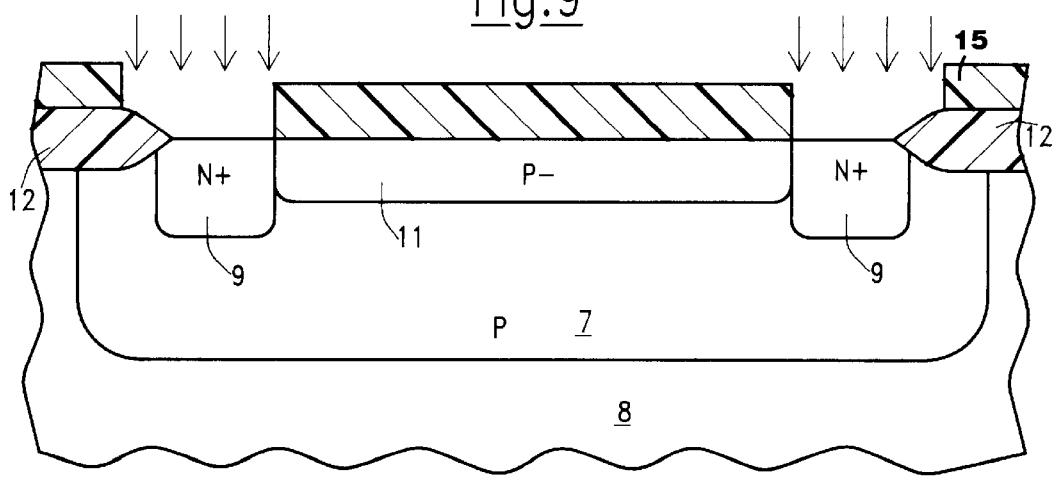

FIGS. 9 and 10 are two cross-sectional views taken at intermediate steps of the manufacturing process of the clamping device according to the second embodiment of the present invention.

As in the previous case, starting from a silicon substrate 3, for example of the P type, field oxide regions 12 are formed on the surface of the substrate 3. The field oxide regions 12 are formed by means of a standard LOCOS process to define active areas of suitable dimensions. In this same step, the field oxide regions 12 form active areas for both the array 1 of memory cells MC and N-channel and P-channel MOSFETs of the logic circuits of the Flash EEPROM.

With a similar process to FIG. 5, a layer of photoresist (not shown) is then deposited and selectively removed by a photolithographic process over the active areas. A P type dopant is implanted into the substrate 3 in a dose of the order of $10^{13}$ atoms/cm$^2$ and with an energy of the order of 1 MeV, to form the P type well 7. In this same step, P type wells are formed in the memory array area, wherein the memory cells are to be formed, and in the areas wherein N-channel MOSFETs are to be formed.

The first photoresist is removed and a second layer of photoresist 14 is then deposited and selectively removed as shown in FIG. 6. A P type dopant, for example BF2 in a dose in the range $1-5 \times 10^{13}$ atoms/cm$^2$, is then selectively implanted into the P type well 7 to form the base region 11 of the bipolar junction transistor forming the clamping device. The extension of the base region 11 determines the clamping voltage VCL. This same implant is used to form graded source and drain regions of the P-channel MOSFETs.

As illustrated in FIG. 10, the second photoresist layer 14 is removed and a third photoresist layer 15 is deposited and selectively removed on the substrate 3 and field oxide regions 12. An N type dopant, for example arsenic in a dose in the range $1-5 \times 10^{15}$ atoms/cm$^2$, is then selectively implanted into the P type well 7, outside the P type base region 11, to form the emitter region 9 and the collector region 10 of the bipolar junction transistor. This same implant is used to form source regions and drain regions of the N-channel MOSFETs.

The subsequent process steps provide, in a totally conventional way, for forming contacts to the emitter region 9 and to the cathode region 10, and for forming metal interconnection lines.

As in the previous case, the bipolar junction transistor forming the clamping device can be fabricated in a typical N-well or twin-well CMOS Flash EEPROM manufacturing process making use of process steps already available, without any additional process step.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A Flash EEPROM comprising an array of memory cells having a common source line connecting together source electrodes of the memory cells, said common source line being coupled to a positive potential when the memory cells must be electrically erased, a resistive feedback element coupled in series between said positive potential and said common source line wherein a voltage limiting device is coupled to said common source line for limiting the potential of the common source line to a prescribed maximum value lower than said positive potential.

2. The Flash EEPROM of claim 1 wherein said positive potential is an external power supply voltage of the Flash EEPROM.

3. The Flash EEPROM of claim 2 wherein said voltage limiting device further includes at least one junction diode having a cathode electrode coupled to the common source line and an anode electrode coupled to a ground potential, said prescribed maximum value being the breakdown voltage of said diode.

4. The Flash EEPROM of claim 3 wherein said at least one diode further includes a plurality of serially connected diodes, said prescribed maximum value being equal to the sum of the breakdown voltages of each diode of said plurality of serially connected diodes.

5. The Flash EEPROM of claim 3 wherein said junction diode further includes:

a first semiconductor region of a first conductivity type forming a cathode of the junction diode;

a second semiconductor region of a second conductivity type formed inside said cathode region and forming an anode region of the junction diode; and an annular semiconductor region of the first conductivity type formed inside said cathode region and surrounding said anode region.

6. The Flash EEPROM of claim 5 wherein said cathode region is formed in a well region of the first conductivity type formed in a semiconductor substrate.

7. The Flash EEPROM of claim 6 wherein said first conductivity type is N type and said second conductivity type is P type.

8. The Flash EEPROM of claim 2 wherein said voltage limiting device further includes a bipolar junction transistor having an emitter electrode coupled to said common source line and a collector electrode coupled to a ground potential, said prescribed maximum value being equal to a turn-on voltage of the bipolar junction transistor.

9. The Flash EEPROM of claim 8 wherein said bipolar junction transistor further includes:
- a first semiconductor region of a first conductivity type forming an emitter region;
- a second semiconductor region of the first conductivity type forming a collector region; and
- a third semiconductor region of a second conductivity type extending between said emitter and collector regions and forming a base region.

10. The Flash EEPROM of claim 9 wherein said emitter region, said collector region and said base region are formed in a well region of the second conductivity type.

11. The Flash EEPROM of claim 10 wherein said first conductivity type is N type, and said second conductivity type is P type.

* * * * *